United States Patent
Akita et al.

(10) Patent No.: US 8,822,977 B2
(45) Date of Patent: Sep. 2, 2014

(54) PHOTODETECTOR AND METHOD OF MANUFACTURING THE PHOTODETECTOR

(75) Inventors: Katsushi Akita, Itami (JP); Takashi Ishizuka, Itami (JP); Kei Fujii, Itami (JP); Hideaki Nakahata, Itami (JP); Youichi Nagai, Osaka (JP); Hiroshi Inada, Osaka (JP); Yasuhiro Iguchi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 31 days.

(21) Appl. No.: 13/806,585

(22) PCT Filed: Jun. 15, 2011

(86) PCT No.: PCT/JP2011/063630
§ 371 (c)(1),
(2), (4) Date: Dec. 21, 2012

(87) PCT Pub. No.: WO2012/002144
PCT Pub. Date: Jan. 5, 2012

(65) Prior Publication Data
US 2013/0099203 A1    Apr. 25, 2013

(30) Foreign Application Priority Data
Jun. 29, 2010 (JP) .............................. 2010-147636

(51) Int. Cl.
| H01L 29/06 | (2006.01) |
| H01L 31/18 | (2006.01) |
| H01L 31/0352 | (2006.01) |
| H01L 31/0304 | (2006.01) |
| B82Y 20/00 | (2011.01) |

(52) U.S. Cl.
CPC ....... *H01L 31/035236* (2013.01); *Y02E 10/544* (2013.01); *H01L 31/18* (2013.01); *H01L 31/1844* (2013.01); *H01L 31/03046* (2013.01); *B82Y 20/00* (2013.01)
USPC .. 257/21; 257/14; 257/E31.033; 257/E31.127

(58) Field of Classification Search
CPC ...... H01L 31/10; H01L 31/18; H01L 31/1844
USPC ........................ 257/21, 14, E31.033, E31.127
See application file for complete search history.

(56) References Cited

U.S. PATENT DOCUMENTS
2010/0051905 A1* 3/2010 Iguchi et al. .................... 257/14

FOREIGN PATENT DOCUMENTS
JP    2009-027049    2/2009
WO   WO-2010/029813  3/2010

OTHER PUBLICATIONS

Sidhu et al., "A Long-Wavelength Photodiode on InP Using Lattice-Matched GaInAs—GaAsSb Type-II Quantum Wells," IEEE Photonics Technology Letters, vol. 17, No. 12, pp. 2715-2717 (2005).
Sidhu et al., "A 2.3 µm Cutoff Wavelength Photodiode on InP Using Lattice-Matched GaInAs—GaAsSb Type II Quantum Wells," 2005 International Conference on Indium Phosphide and Related Materials, pp. 148-151 (2005).

* cited by examiner

*Primary Examiner* — Andy Huynh
(74) *Attorney, Agent, or Firm* — Venable LLP; Michael A. Sartori; Tamatane J. Aga

(57) ABSTRACT

A photodetector and a method of manufacturing the photodetector are provided, in which variation in sensitivity is suppressed over the near-infrared region from the short wavelength side including 1.3 µm to the long wavelength side. The photodetector includes, on an InP substrate, an absorption layer of a type II multiple quantum well structure comprising a repeated structure of a GaAsSb layer and an InGaAs layer, and has sensitivity in the near-infrared region including wavelengths of 1.3 µm and 2.0 µm. The ratio of the sensitivity at the wavelength of 1.3 µm to the sensitivity at the wavelength of 2.0 µm is not smaller than 0.5 but not larger than 1.6.

10 Claims, 8 Drawing Sheets

LIGHT

PHOTODETECTOR AND METHOD OF MANUFACTURING THE PHOTODETECTOR

TECHNICAL FIELD

The present invention relates to a photodetector, and a method of manufacturing the photodetector. More particularly, the invention relates to: a photodetector in which an absorption layer includes a type II multiple-quantum well (hereinafter, referred to as "MQW") structure having sensitivity in a long wavelength region of the near-infrared; and a method of manufacturing the photodetector.

BACKGROUND ART

Since a group III-V compound semiconductor grown on an InP substrate has a band gap energy corresponding to the near-infrared region, photodetectors for communication, analysis, night photography; and the like, adopting such a group III-V compound semiconductor, have been studied and developed.

Non-Patent Literature 1 discloses a sample of a photodetector including an InGaAs/GaAsSb type II MQW absorption layer on an InP substrate. This photodetector has a cutoff wavelength of 2.39 μm. Spectral sensitivity characteristics at wavelengths from 1.7 μm to 2.7 μm are shown.

Meanwhile, Non-Patent Literature 2 discloses spectral sensitivities at wavelengths from 1 μm to 3 μm (temperature: 200 K, 250 K, 295K) of a photodetector including InGaAs/GaAsSb type II MQW on an InP substrate. In this photodetector, InGaAs and GaAsSb each have a thickness of 5 nm, and 150 pairs of InGaAs and GaAsSb are stacked. The photodetector has a cutoff frequency of 2.3 μm.

CITATION LIST

Non Patent Literature

[NON PATENT LITERATURE 1] R. Sidhu, et. al. "A Long-Wavelength Photodiode on InP Using Lattice-Matched GaInAs—GaAsSb Type-II Quantum Wells", IEEE Photonics Technology Letters, Vol. 17, No. 12 (2005), pp. 2715 to 2717

[NON PATENT LITERATURE 2] R. Sidhu, et. al. "A 2.3 μm cutoff wavelength photodiode on InP using lattice-matched GaInAs—GaAsSb type II quantum wells", 2005 International Conference on Indium Phosphide and Related Materials

SUMMARY OF THE INVENTION

Problems to be Solved by the Invention

In the above-described photodetectors, the absorption region is shifted toward longer wavelengths by using the InGaAs/GaAsSb type II MQW. Therefore, type II transition is attracting attention, in which electrons in the valence band of the GaAsSb layer transit to the conduction band of the InGaAs layer. Since the electrons in the valence band of the GaAsSb layer transit to the conduction band of the InGaAs layer, the type II transition in the type II MQW is likely to occur at the InGaAs/GaAsSb interface.

Meanwhile, in the InGaAs/GaAsSb type II MQW, type I transition also occurs in parallel with the type II transition. In the type I transition, the electrons in the valence bands of the GaAsSb and InGaAs layers transit to the conduction bands of the respective layers. In this case, the wavelengths of light to be absorbed due to the type I transition are obviously shorter than the maximum wavelength to be absorbed due to the type II transition.

Since the above-described photodetectors are assumed to be used for gas analysis and the like, and also for other reasons, it is essential for the photodetectors to have sensitivities higher than a predetermined value, particularly, substantially constant sensitivities, in the near-infrared region not lower than 1.3 μm. In the above-described Non-Patent Literatures, however, the sensitivity of the former photodetector sharply increases at a wavelength of 1.7 μm although the sensitivity is almost constant at wavelengths from 1.8 μm to 2.3 μm. In the latter photodetector, although the sensitivity is constant on the long wavelength side, the sensitivity sharply drops at wavelengths of 1.5 μm and shorter. Such variation in sensitivity must be avoided.

In other words, the wavelength dependence of sensitivity must be flattened within a practically allowed range.

An object of the present invention is to provide: a photodetector in which variation in sensitivity is suppressed over the near-infrared range from the short wavelength side including 1.3 μm to the long wavelength side; and a method of manufacturing the photodetector.

Solution to the Problems

The present invention provides a photodetector which includes, on a group III-V semiconductor substrate, an absorption layer of a type II multiple quantum well (MQW) structure comprising a repeated structure of a first compound semiconductor and a second compound semiconductor, and has sensitivity in a near-infrared region including wavelengths of 1.3 μm and 2.0 μm. The ratio of the sensitivity at the wavelength of 1.3 μm to the sensitivity at the wavelength of 2.0 μm is not smaller than 0.5 but not larger than 1.6.

The photodetector according to the present invention includes the type II MQW structure. In the type II MQW structure, one compound semiconductor layer (hereinafter, referred to as "a layer", e.g., a GaAsSb layer) is higher in the valence band energy and the conduction band energy than the other compound semiconductor layer (hereinafter, referred to as "b layer", e.g., an InGaAs layer). However, since the Fermi levels of the a layer and the b layer coincide with each other, the conduction band of the other compound semiconductor layer (b layer) having the lower valence band and conduction band energies has a higher energy level than the valence band of the one compound semiconductor layer (a layer) having the higher valence band and conduction band energies. When light is incident on the type II MQW structure, electrons positioned in the valence band of the a layer absorb the incident light, and are excited to the conduction band of the b layer. As a result, holes are generated in the valence band of the a layer, and the excited electrons are positioned in the conduction band of the b layer. In this way, the electrons in the valence band of the a layer being excited to the conduction band of the b layer enables the photodetector to absorb incident light of lower energy (longer wavelength). This phenomenon is called "type II transition (absorption)" which occurs at the interface between the a layer and the b layer.

The type II transition determines the maximum wavelength in the absorption region, and therefore, the absorption region caused by the type II transition covers a long wavelength region with the maximum wavelength being an upper limit, for example, 1.7 μm and higher. However, the photodetector needs to have sensitivity also in a shorter wavelength region. In the above-described type II MQW structure, not only the type II transition but also type I transition occur. The type I transition does not occur at the interface between the a layer and the b layer, but occurs in the a layer and in the b layer. The band gap energies of the a layer and the b layer are approximately the same, as seen from an example of combination of GaAsSb and InGaAs. When the type I absorption occurs in the a layer or the b layer, the electrons in the valence band of the a layer or the b layer are excited to the conduction band of each layer, and thereby holes are generated in the valence band of each layer. The type I transition and the type II transition are identical in that the holes are generated in the valence band, and the electrons are excited to the conduction band.

In the present invention, by adjusting the total thickness of the MQW structure, the thicknesses of the respective layers in the MQW structure, or the like it is possible to suppress variation in sensitivity over a range from the short wavelength side including 1.3 µm to the long wavelength side up to, for example, 2.5 µm.

The photodetector may be configured so that incident light enters the photodetector from the substrate side. In the photodetector of the present invention, a p-side electrode is disposed on the absorption layer, and an n-side electrode is disposed on a layer (or the substrate) positioned close to the substrate with respect to the absorption layer. The reason why the p-side electrode is disposed on the absorption layer is as follows. There has been accumulated an enormous amount of technology for Zn which is a p-type impurity for group III-V compound semiconductors. A pixel region can be easily formed by introducing such Zn by selective diffusion from the surface of epitaxial layers including the absorption layer. Therefore, the p-side electrode is disposed on the surface of the epitaxial layers. One or a plurality of pixel region(s) is/are formed. When a plurality of pixel regions are formed, a p-side electrode is arranged in each pixel region. Therefore, the p-side electrode is sometimes called a pixel electrode. On the other hand, the n-side electrode is a common ground electrode. That is, in any of the cases of one p-side electrode and a plurality of p-side electrodes, the n-side electrode is a ground electrode common to the respective pixels.

Since the p-side electrode and the n-side electrode are arranged as described above, when absorption phenomenon occurs, regardless of whether it is the type I absorption or the type II absorption, holes and electrons are guided to the p-side electrode and the n-side electrode, respectively, by an electric field under reverse bias.

When a plurality of pixels are two-dimensionally arrayed, lines for reading electric charges from the pixel electrodes (p-side electrodes) are complicated, and become an obstacle to propagation of light. In this case, the epitaxial layer side cannot be the light incident surface. Therefore, light is incident on the substrate. Readout electrodes of an readout IC (ROIC) formed of a complementary metal oxide semiconductor (CMOS) and the like are conductively connected to the p-side electrodes by interconnection bumps or the like so that the readout electrodes are opposed to the p-side electrodes one-to-one.

When light enters the photodetector from the substrate side, absorption occurs in a part of the MQW structure near the substrate, which causes holes and electrons. It is known that the mobility of holes is lower than that of electrons. Even with the electric field under reverse bias, the holes, having low mobility, should travel across many quantum well potentials to reach the p-side electrode. In contrast, the electrons, having high mobility, travel a relatively short distance to reach the n-side electrode provided on the substrate or on a buffer layer in contact with the substrate.

The structure in which incident light enters the photodetector from the substrate side is, for example, a structure in which an antireflection (AR) layer is provided on the rear surface of the substrate.

The total thickness of the MQW structure may be not smaller than 0.5 µm but not larger than 3.5 µm. The total thickness of the MQW structure greatly influences the holes having low mobility when the holes reach the pixel electrode from the position near the substrate, regardless of whether the transition type is the type I or II. When the total MQW thickness is not larger than 3.5 µm, the holes caused by light absorption travel across almost the entire thickness of the MQW structure (because the light absorption occurs near the substrate), and easily reach the pixel electrode, regardless of whether the transition type is the type I or II.

On the other hand, when the total MQW thickness is smaller than 0.5 µm, the type I transition cannot be sufficiently increased, or the number of pairs cannot be increased to secure the sensitivity caused by the type II transition. Anyway, sufficiently high sensitivity cannot be achieved.

Both the thickness of the first compound semiconductor and the thickness of the second compound semiconductor may be not smaller than 0.75 nm but not larger than 5 nm.

When the thicknesses of the respective layers in the MQW structure are reduced to 5 nm or less, the easiness of light absorption due to the type I transition which is transition in the quantum well is not greatly different from the easiness of light absorption due to the type II transition which is transition at the quantum well interface. Therefore, the region where light absorption is caused by the type I transition is not greatly different from the region where light absorption is caused by the type II transition. Therefore, the easiness for the holes caused by the type I transition to reach the pixel region is not greatly different from the easiness for the holes caused by the type II transition to reach the pixel region. Accordingly, the sensitivity at the wavelength corresponding to the type I transition is not greatly different from the sensitivity at the wavelength corresponding to the type II transition, and thus the wavelength dependence of the sensitivity is flattened.

On the other hand, when the quantum well thickness is larger than 5 nm, the type I transition is likely to occur in a region near the substrate (light of the wavelength corresponding to the type I transition is likely to be absorbed in the region near the substrate), and light of the wavelength corresponding to the type II transition reaches a region near the pixel region (p-type region) (light of the wavelength corresponding to the type II transition is not likely to be absorbed in the region near the substrate). Therefore, the holes caused by the type II transition are more likely to reach the pixel region (p-type region) as compared to the holes caused by the type I transition. Accordingly, the sensitivity at the wavelength corresponding to the type I transition is degraded while the sensitivity at the wavelength corresponding to the type II transition is increased, and thus the wavelength dependence of the sensitivity is increased. For the above reasons, the thicknesses of the respective layers in the MQW structure are not larger than 5 nm.

On the other hand, when the thicknesses of the respective layers are smaller than 0.75 nm, the interface state density becomes excessive, and the sensitivity caused by the type I transition becomes excessively low. Therefore, flatness of the sensitivity of the entire structure cannot be ensured. For the above reasons, the thicknesses of the respective layers are preferably not smaller than 0.75 nm.

The substrate may comprise InP, and the MQW structure may be a repeated structure of $In_xGa_{1-x}As$ ($0.38 \leq x \leq 0.68$, hereinafter referred to as "InGaAs") and $GaAs_{1-y}Sb_y$ (0.36≤y≤0.62, hereinafter referred to as "GaAsSb"). Thereby, it is possible to obtain a type II MQW structure having sensitivity even in the long wavelength region of the near-infrared, by using existing equipment.

InP-based epitaxial layers including the MQW structure are provided on the InP substrate. An InP window layer may be provided at the front surface of the InP-based epitaxial layers, and no regrown interface may be formed between the bottom surface and the front surface of the InP-based epitaxial layers.

The regrown interface is an interface between a first crystalline layer and a second crystalline layer which are grown in such a manner that the first crystalline layer is grown by a predetermined growth method and exposed to the atmosphere, and thereafter, the second crystalline layer is grown on and in contact with the first crystalline layer by another growth method. Usually, oxygen and carbon are mixed as impurities at high concentration. The high concentration means, for example, an atomic concentration of $1 \times 10^{18}$ cm$^{-3}$ or more. Since the semiconductor device of the present invention preferably does not have such regrown interface, excellent crystallinity can be ensured up to the surface of the InP window layer, thereby contributing to reduction in dark current.

Further, it is possible to manufacture the photodetector with high efficiency. That is, as described later, since the layers from (the buffer layer to the MQW structure) to the InP window layer containing phosphorus are consistently grown by all metal-organic source MOVPE, manufacturing of these layers can be continuously executed in the same growth chamber. Further, although the InP window layer containing, for example, phosphorus is formed, since solid phosphorus is not used as a source, no phosphorus attaches to the inner wall of the growth chamber. Therefore, ignition or the like is not likely to occur at maintenance, resulting in excellent security.

The present invention provides a method of manufacturing a photodetector which includes, on a group III-V semiconductor substrate, an absorption layer of a type II multiple quantum well (MQW) structure comprising a repeated structure of a first compound semiconductor and a second compound semiconductor, and has sensitivity in a near-infrared region including wavelengths of 1.3 μm and 2.0 μm. The ratio of the sensitivity at the wavelength of 1.3 μm to the sensitivity at the wavelength of 2.0 μm is not smaller than 0.5 but not larger than 1.6.

By adopting the above-described manufacturing method, it is possible to easily obtain a photodetector in which the wavelength dependence of sensitivity in the near-infrared region is flattened to a level that causes no problem in practical use.

The photodetector may be configured such that incident light enters the photodetector from the substrate side. Therefore, for example, an AR layer may be provided on the rear surface of the substrate, and, two-dimensionally arrayed pixel electrodes may be conductively connected to readout electrodes of a ROIC by interconnection bumps or the like so that the readout electrodes are opposed to the pixel electrodes one-to-one.

The total thickness of the MQW structure may be not smaller than 0.5 μm but not larger than 3.5 μm. As described above, this total MQW thickness allows the photodetector to maintain the sensitivity at a predetermined level or more.

The thickness of the first compound semiconductor layer and the thickness of the second compound semiconductor layer may be not smaller than 0.75 nm but not larger than 5 nm. Thereby, it is possible to flatten the sensitivity over a range from the wavelength of 1.3 μm to the wavelength of 2.5 μm, while maintaining the sensitivity.

The substrate may comprise InP, and the MQW structure may be a repeated structure of InGaAs and GaAsSb. Thereby, the flatness of the wavelength dependence of sensitivity can be improved over the above-mentioned near-infrared region, while increasing the sensitivities due to the type I and type II transitions.

InP-based epitaxial layers including an MQW structure are located on an InP substrate, and an InP window layer is provided at the surface of the InP-based epitaxial layers. The InP-based epitaxial layers including the MQW structure and the InP window layer can be grown on the InP substrate consistently by metal-organic vapor phase epitaxy using only metal-organic sources. The metal-organic vapor phase epitaxy using only meta-organic sources is a growth method in which metal-organic sources composed of compounds of organic materials and metals are used as all sources for vapor phase epitaxy, and it is referred to as "all metal-organic source MOVPE".

According to the above-mentioned method, the above-mentioned photodetector can be manufactured with high efficiency. That is, since the layers up to the InP window layer containing phosphorus are grown consistently by all metal-organic source MOVPE, manufacturing of these layers can be continuously executed in the same growth chamber. Since the grown layers have no regrown interface, epitaxial layers of excellent crystallinity can be obtained. Therefore, reduction of dark current or the like can be achieved. Further, when the InP window layer containing phosphorus is formed, since solid phosphorus is not used as a source, no phosphorus attaches to the inner wall of the growth chamber. Therefore, ignition or the like is not likely to occur at maintenance, resulting in excellent security.

The all metal-organic source MOVPE has another advantage in that an MQW structure having sharp heterointerfaces between the respective layers can be formed. The MQW structure with sharp heterointerfaces allows highly accurate spectroscopy and the like. Further, a good-quality type II MQW structure can be manufactured by growing the MQW by the all metal-organic source MOVPE, and thereby the ratio of the sensitivity at the wavelength of 1.3 μm to the sensitivity at the wavelength of 2.0 μm can be easily kept in a range not smaller than 0.5 but not larger than 1.6.

In the MQW formation process, the MQW structure can be formed at a temperature not lower than 400° C. but not higher than 560° C. Thereby, an MQW structure having excellent crystallinity is obtained, and dark current can be further reduced. The temperature is the substrate surface temperature monitored by a pyrometer including an IR camera and an IR spectrometer. Accordingly, the substrate surface temperature is, to be exact, the temperature at the surface of the epitaxial layers that are being grown on the substrate. Although the temperature has various names such as "substrate temperature", "growth temperature", "deposition temperature" and the like, each indicates the monitored temperature.

Advantageous Effects of the Invention

According to the photodetector and the like of the present invention, it is possible to flatten the wavelength dependence of sensitivity to a level that causes no problem in practical use, over the near-infrared region from the wavelength of 1.3 μm to the long wavelength side. That is, the ratio of the sensitivity at the wavelength of 1.3 μm to the sensitivity at the wavelength of 2.0 μm can be kept within a predetermined range by causing the type I absorption and the type II absorption to occur without a great difference between them in the MQW structure. Reduction in the thicknesses of the respective layers in the MQW structure and reduction in the total thickness of the MQW structure greatly contribute to the flatness of the wavelength dependence of sensitivity. Further, since the layers from the MQW absorption layer to the InP window layer are consistently grown by, for example, the all metal-organic source MOVPE, high manufacturing efficiency is achieved. Further, since phosphorus does not attach to the inner wall of the growth chamber, excellent security is also achieved.

DESCRIPTION OF EMBODIMENTS (Embodiment 1)

Figure 1:
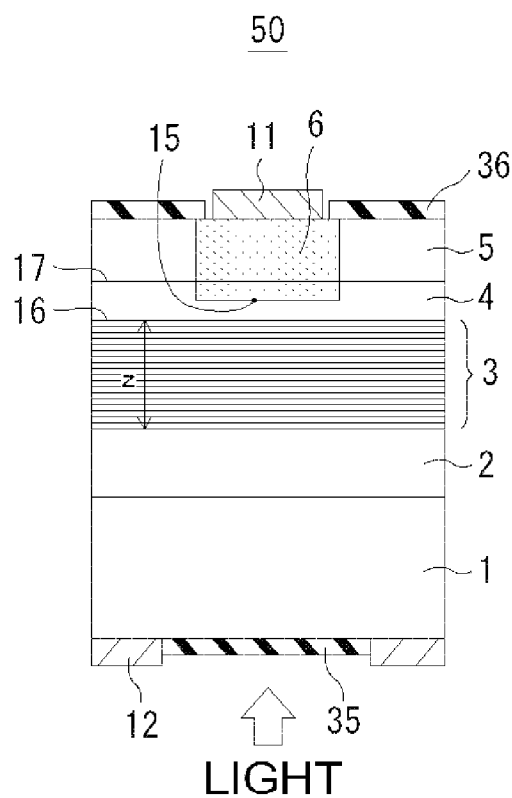
FIG. 1 is a diagram illustrating a photodetector according to Embodiment 1 of the present invention.

FIG. 1 is a diagram illustrating a photodetector 50 according to Embodiment 1 of the present invention. The photodetector 50 includes, on an InP substrate 1, an InP-based semiconductor layered structure (epitaxial wafer) having a configuration described below.

(InP substrate 1/InP buffer layer 2/type II (InGaAs/GaAsSb) MQW absorption layer 3/InGaAs layer 4/InP window layer 5)

A p-type region 6 is located from the surface of the InP window layer 5 to the inside of the InGaAs layer 4. The p-type region 6 is formed by selectively diffusing Zn as a p-type impurity from an opening of a selective diffusion mask pattern 36 of an SiN film. By adjusting the opening of the selective diffusion mask pattern 36, the p-type region 6 can be formed so as to be apart by a predetermined distance from each side surface. A p-side electrode 11 composed of AuZn is disposed on and in ohmic contact with the p-type region 6, and an n-side electrode 12 composed of AuGeNi is disposed on and in ohmic contact with the rear surface of the InP substrate 1. In this case, the InP substrate 1 is doped with an n-type impurity, and has a predetermined level of conductivity. The photodetector 50 has an SiON antireflection layer 35 provided on the rear surface of the InP substrate 1, and is used such that light is incident on the rear surface of the InP substrate. In the type II MQW absorption layer 3, a p-n junction 15 is formed at a position corresponding to a boundary front of the p-type region 6. By applying a reverse bias voltage between the p-side electrode 11 and the n-side electrode 12, a larger depletion layer is formed on the side where the n-type impurity concentration is lower (n-type impurity background). The background impurity concentration in the InGaAs layer 4 and the MQW absorption layer 3 is, as an n-type impurity concentration (carrier concentration), about $5 \times 10^{15}$ cm$^{-3}$ or lower. The position of the p-n junction 15 is determined by an intersection point (intersection plane) between the background impurity concentration (n-type carrier concentration) of the InGaAs layer 4 and the concentration profile of Zn as a p-type impurity. The InGaAs layer 4 is provided in order to adjust the concentration distribution of the p-type impurity in the MQW constituting the absorption layer 3. However, the InGaAs layer 4 may not be necessarily formed. In the absorption layer 3, the Zn concentration is preferably $5 \times 10^{16}$ cm$^{-3}$ or lower.

The depletion layer is extended through the InGaAs layer 4 into the MQW absorption layer 3 when waiting for light absorption. The depletion layer is extended up to a position in the MQW structure near the buffer layer 2. When light is incident on the InP substrate 1, absorption occurs in a position in the depletion layer near the InP substrate 1. As a result of the absorption, electrons are generated in the conduction band and holes are generated in the valence band. The electrons are driven to the n-side electrode 12 and the holes are driven to the p-side electrode due to an electric field under reverse bias. The mobility of the holes is considerably lower than that of the electrons. Above all, since the absorption occurs in the position in the MQW structure near the InP substrate 1, the holes should travel across several hundreds of quantum well potentials. Therefore, among the holes generated in the valence band, many holes cannot reach the p-side electrode 11, resulting in a serious factor that causes reduction in sensitivity.

The photodetector 50 according to the present embodiment is characterized in the following points.

(1) The number of pairs of InGaAs and GaAsSb is not smaller than 50 but not larger than 500.

(2) The thicknesses of InGaAs and GaAsSb are both not smaller than 0.75 nm but not larger than 5 nm.

(3) The total thickness z of the MQW structure is not smaller than 0.5 µm but not larger than 3.5 µm.

(4) The ratio of the sensitivity at the wavelength of 1.3 µm to the sensitivity at the wavelength of 2.0 µm is not smaller than 0.5 but not larger than 1.6.

It is easy to satisfy the condition (4) by satisfying the conditions (1) to (3).

The number of pairs not smaller than 50 (condition (1)) is required for increasing the number of InGaAs/GaAsSb interfaces to increase the sensitivity caused by the type II transition. This is because the type II transition (absorption) occurs at the interfaces. Although the photodetector intended by the present invention increases the sensitivity in the wavelength region in which the type II transition mainly occurs, if the number of pairs exceeds 500, the type II transition occurs more excessively as compared to the type I transition, which makes it difficult to flatten the wavelength dependence of the sensitivity. In the photodetector of the present invention, in order to first secure the sensitivity on the long wavelength side, a necessary number of pairs is secured as described above. Therefore, the photodetector of the present invention is based on the premise that the type II transition occurs more than the type I transition, that is, the type II transition is excessive rather than the type I transition. Also in the following description, it is premised that the type II transition is excessive, that is, the sensitivity on the long wavelength side is sufficiently secured.

Figure 2:
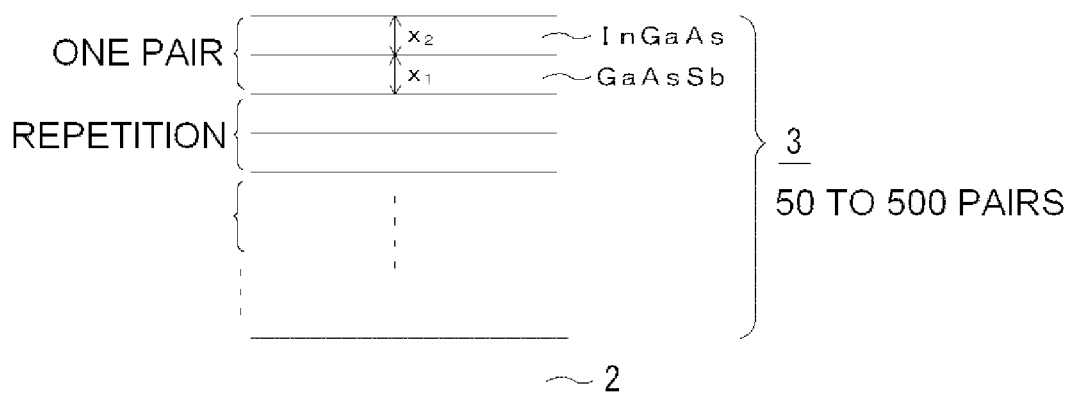
FIG. 2 is a diagram illustrating respective layers in an MQW structure shown in FIG. 1.

FIG. 2 is a diagram illustrating the layers in the MQW structure constituting the absorption layer 3. The thickness of each GaAsSb layer is $x_1$, and the thickness of each InGaAs layer is $x_2$. A difference between the thickness $x_1$ and the thickness $x_2$ is smaller than ±1.0 nm. Unless otherwise noted, the thicknesses $x_1$ and $x_2$ may be regarded as the same.

Figure 3:
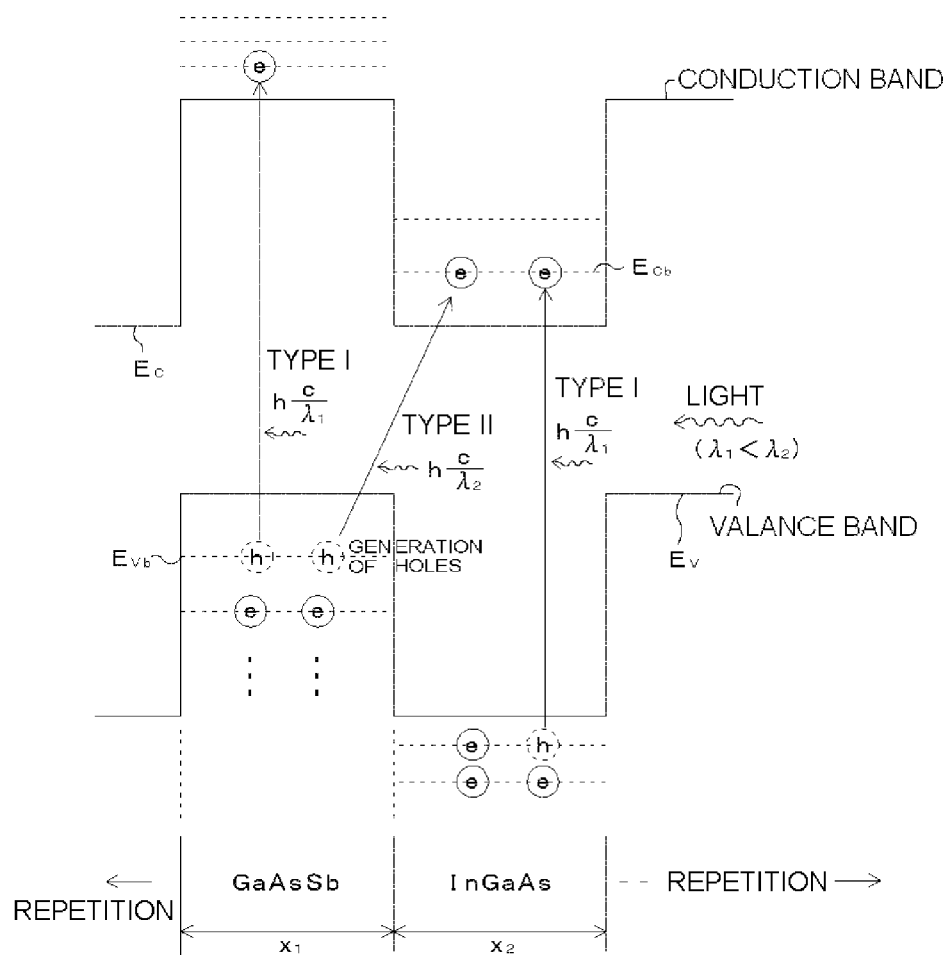
FIG. 3 is a diagram for explaining absorption phenomenon by using an MQW band structure.

FIG. 3 is a diagram for explaining the absorption phenomenon by using the MQW band structure. The type I transition (absorption) is caused by that electrons positioned in an upper part of the valence band $E_V$ of the GaAsSb layer (the InGaAs layer) absorb light of the corresponding energy ($h(c/\lambda_1)$, where $\lambda_1$ is the wavelength, h is the Plank's constant, and c is the velocity of light in the medium), and are excited to the conduction band $E_C$ of the layer. The wavelength $\lambda_1$ is about 1.7 µm or less in the InGaAs/GaAsSb MQW structure. The threshold wavelength $\lambda_1$ is not very precise but is roughly estimated. The wavelength $\lambda_1$ is smaller than a wavelength $\lambda_2$ of light that causes the type II transition described later. That is, the energy gap between the valence band and the conduction band in the same layer where the type I transition occurs is larger than that of the type II transition.

The type II transition is caused by that electrons positioned in an upper part of the valence band of the GaAsSb layer absorb light of the corresponding energy $h(c/\lambda_2)$, and are excited to the conduction band of the adjacent InGaAs layer. The wavelength $\lambda_2$ exceeds about 1.7 µm in the InGaAs/GaAsSb MQW structure. The wavelength $\lambda_2$ is larger than the wavelength $\lambda_1$ of light that causes the type I transition.

In the type I and type II transitions, holes are generated in the valence band, and should travel across uneven quantum well potentials before reaching the p-side electrode. Likewise, the electrons also travel across the uneven quantum well potentials to reach the n-side electrode. However, since the position where the electrons are generated is near the InP substrate, the number of quantum well potentials across which the electrons should travel is small. Above all, the mobility of the electrons is considerably larger than that of the holes. Therefore, failure of the electrons to reach the n-side electrode does not cause a problem.

By reducing the thicknesses of the respective layers in the MQW structure, the holes generated due to the type I and type II transitions become more likely to reach the p-side electrode across the many quantum wells, even though the mobility of the holes is low.

(i) Type I Absorption:

Electrons in the valence bands of InGaAs and GaAsSb are excited to the conduction bands of the respective layers, and thereby holes are generated in the valence bands. As described above, the holes cannot reach the p-side electrode unless traveling across many quantum well potentials (almost equal to the number of pairs=number of repetitions). Regardless of the position where the holes are generated, the holes, even those generated in the valence band of InGaAs, move in the ground state near the bottom of the valence band of GaAsSb. The holes that have once entered the valence band of GaAsSb should go across a quantum well potential to reach the valence band of the adjacent InGaAs. If the thickness of the quantum well is reduced, the energy of the ground state in the valence band of GaAsSb gets apart from the bottom, and approaches the energy of the valence band of the adjacent InGaAs. This is similar to the phenomenon in which, when electrons as a wave are confined in the quantum well potential and the quantum well is narrowed, the electrons are oscillated at a high energy.

Figure 4A:
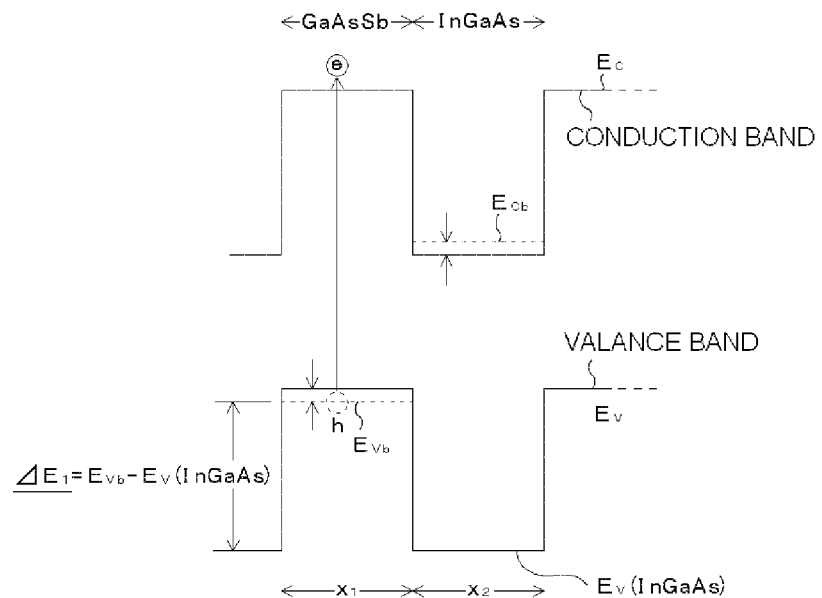
FIG. 4A is a schematic diagram illustrating influence of quantum well thicknesses $x_1$ and $x_2$ on the energy level of a ground state formed in a quantum well potential, wherein $E_{Cb}$ indicates the energy level of the ground state in the conduction band of InGaAs, and $E_{Vb}$ indicates the energy level of the ground state in the valence band of GaAsSb.
Figure 4B:
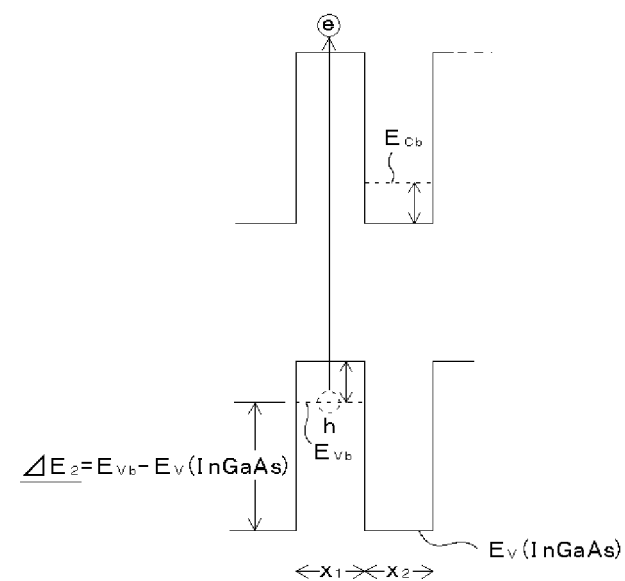
FIG. 4B is a schematic diagram illustrating influence of the quantum well thicknesses $x_1$ and $x_2$ on the energy level of the ground state formed in the quantum well potential, wherein $E_{Cb}$ indicates the energy level of the ground state in the conduction band of InGaAs, and $E_{Vb}$ indicates the energy level of the ground state in the valence band of GaAsSb. The quantum well thicknesses $x_1$ and $x_2$ in FIG. 4B are smaller than those in FIG. 4A.

FIG. 4A is a schematic diagram illustrating the influence of the quantum well thicknesses $x_1$ and $x_2$ on the ground state formed in the quantum well potential. The ground state is a state of minimum energy that the electrons or holes can obtain in the quantum well potential. The ground state is not a state of zero energy, but has a predetermined energy. The quantum well thicknesses $x_1$ and $x_2$ shown in FIG. 4B are smaller than those shown in FIG. 4A. When the quantum well thickness is reduced, the quantum well potential is narrowed naturally. As a result, the energy of the ground state is increased ($0<\Delta E_2<\Delta E_1$).

As the energy of the ground state is increased, the energies of other excited states are also increased. Therefore, increasing the energy of the ground state is equivalent to raising the valence band of GaAsSb. In this case, the holes may enter the valence band of GaAsSb, but can easily move away from the valence band. As a result, the holes are allowed to easily move in the MQW structure.

(ii) Type II Absorption:

Quantum well potentials in the valence bands of GaAsSb are formed by the valence bands of InGaAs on the both sides of GaAsSb. Since the holes in the valence band occupies the ground state near the bottom of the valence band, the holes should travel across the energy barrier to reach the valence band of the adjacent InGaAs. If the quantum well thickness is reduced, the energy of the ground state in the valence band approaches the energy of the valence band of the adjacent InGaAs. Therefore, the holes caused in the valence band by absorption become, in the valence band, more likely to move to the valence band of the adjacent InGaAs. The same is true not only for holes that have fallen into the valence band of GaAsSb in the initial step of movement but also for holes that have fallen into the valence band during drifting.

Figure 5A:
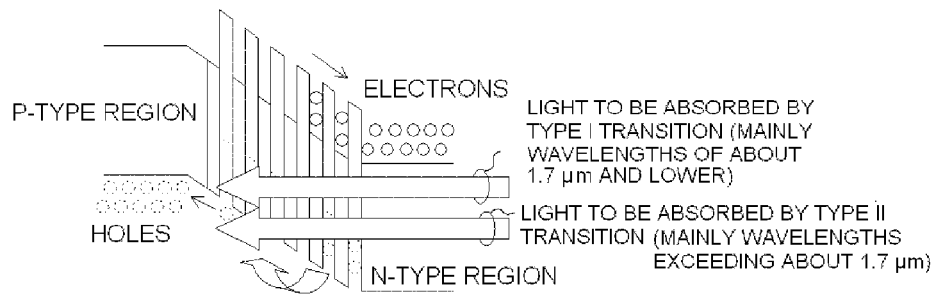
FIG. 5A is a schematic diagram illustrating the relationship between the quantum well thicknesses $x_1$ and $x_2$ and the flowability of holes.
Figure 5B:
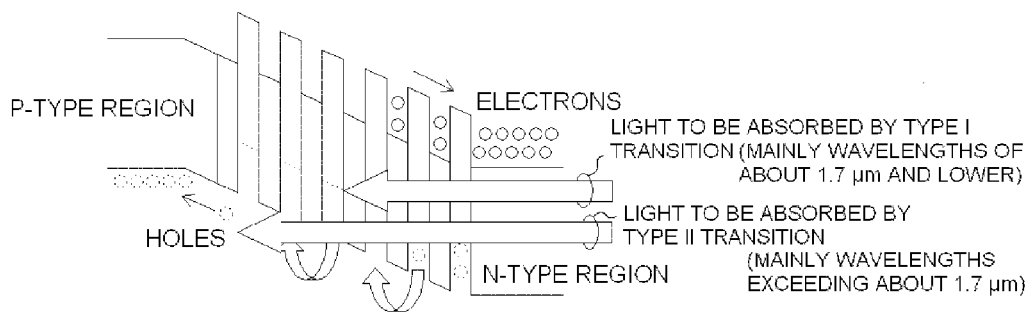
FIG. 5B is a schematic diagram illustrating the relationship between the quantum well thicknesses $x_1$ and $x_2$ and the flowability of holes. The quantum well thicknesses $x_1$ and $x_2$ in FIG. 5B are larger than those in FIG. 5A.

FIG. 5A is a schematic diagram illustrating the relationship between the quantum well thicknesses $x_1$ and $x_2$, and the flowability of holes. The quantum well thicknesses $x_1$ and $x_2$ shown in FIG. 5A are thinner than those shown in FIG. 5B. By reducing the quantum well thicknesses $x_1$ and $x_2$, both the holes caused by the type I transition and the holes caused by the type II transition become more likely to reach the p-type region as shown in FIG. 5A.

When the thicknesses of the respective layers in the MQW structure are reduced to 5 nm or less, the easiness of light absorption due to the type I transition which is transition in the MQW is not greatly different from the easiness of light absorption due to the type II transition which is transition at the MQW interface. Therefore, the region where light absorption is caused by the type I transition is not greatly different from the region where light absorption is caused by the type II transition. Therefore, the easiness for the holes caused by the type I transition to reach the pixel region is not greatly different from the easiness for the holes caused by the type II transition to reach the pixel region. Accordingly, the sensitivity at the wavelength corresponding to the type I transition is not greatly different from the sensitivity at the wavelength corresponding to the type II transition, and thus the wavelength dependence of the sensitivity is flattened.

On the other hand, when the thicknesses of the respective layers in the MQW structure are larger than 5 nm or when the total thickness of the MQW structure is larger than 3.5 µm, the type I transition is likely to occur in a region near the substrate (in other words, light of the wavelength corresponding to the type I transition is likely to be absorbed in the region near the substrate), and light of the wavelength corresponding to the type II transition reaches a region near the pixel region (p-type region) (in other words, light of the wavelength corresponding to the type II transition is less likely to be absorbed in the region near the substrate). Therefore, the holes caused by the type II transition are more likely to reach the pixel region (p-type region) as compared to the holes caused by the type I transition. Accordingly, the sensitivity at the wavelength corresponding to the type I transition is decreased while the sensitivity at the wavelength corresponding to the type II transition is increased, and thus the wavelength dependence of the sensitivity is increased. For the above reasons, the thicknesses of the respective layers are not larger than 5 nm, and the total thickness of the MQW structure is not larger than 3.5 µm.

On the other hand, when the thicknesses of the respective layers in the MQW structure are smaller than 0.75 nm, the interface state density becomes excessive, and the sensitivity caused by the type I transition becomes excessively low. In this case, the flatness of the sensitivity in the entire range cannot be ensured. For the above reasons, the thicknesses of the respective layers are preferably not smaller than 0.75 nm.

Figure 6:
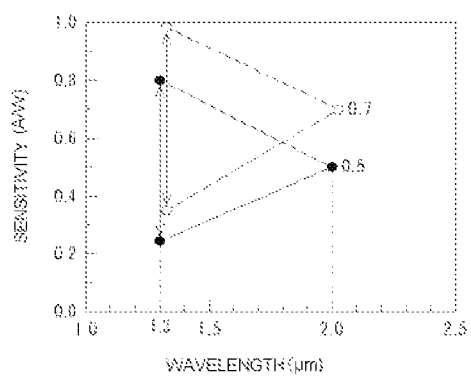
FIG. 6 is a graph illustrating a range in which, when the sensitivity at a wavelength of 2.0 µm is 0.5 A/W (filled circle) and 0.7 A/W (open circle), the sensitivity at a wavelength of 1.3 µm is 0.5 to 1.6 times of the sensitivity at 2.0 µm.

In the photodetector of the present invention, by satisfying the above-described conditions (1), (2), and (3), the ratio of the sensitivity at the wavelength of 1.3 µm to the sensitivity at the wavelength of 2.0 µm is easily set to be not smaller than 0.5 but not larger than 1.6. FIG. 6 is a graph showing a range in which the sensitivity at the wavelength of 1.3 µm is 0.5 to 1.6 times of the sensitivity at the wavelength of 2.0 µm, in cases where the sensitivity at the wavelength of 2.0 µm is 0.5 A/W and 0.7 A/W. As the sensitivity at the wavelength of 2.0 µm, 0.5 A/W and 0.7 A/W are appropriate values. It is apparent that the range of the sensitivity shown in FIG. 6 surely has flatness that causes no problem in practical use.

<MQW Growth Method>

A description will be given of a manufacturing method. An InP substrate 1 is prepared. On the InP substrate 1, an InP buffer layer 2, a type II (InGaAs/GaAsSb) MQW absorption layer 3, an InGaAs diffusive-concentration-distribution-adjusting layer 4, and an InP window layer 5 are grown by all metal-organic source MOVPE. Hereinafter, a method of growing the type II (InGaAs/GaAsSb) MQW absorption layer 3 will be described in detail.

Figure 7:
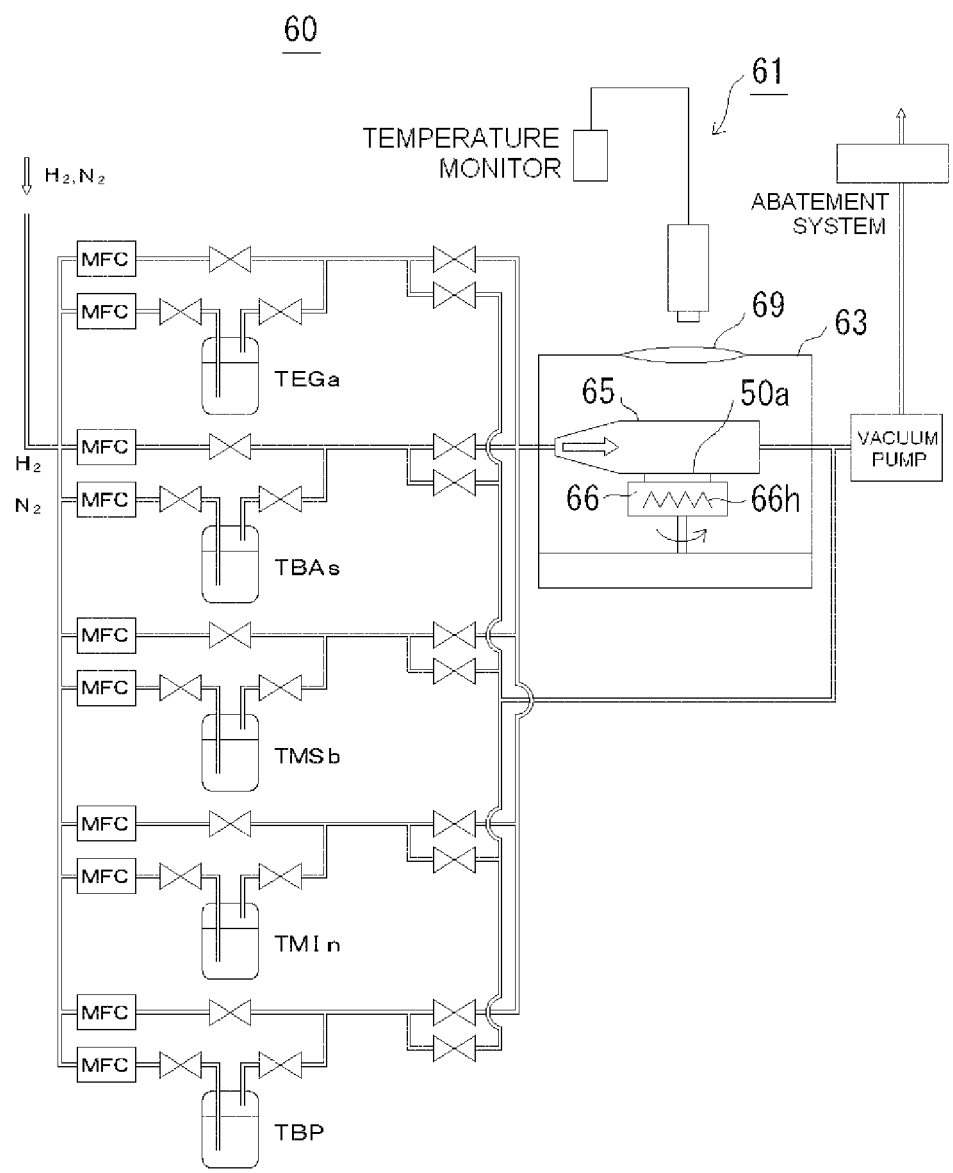
FIG. 7 is a diagram illustrating a piping system and the like in a deposition apparatus for all metal-organic source MOVPE.

FIG. 7 illustrates a piping system and the like of a deposition apparatus 60 for all metal-organic source MOVPE. A quartz tube 65 is placed inside a reaction chamber 63, and source gases are introduced into the quartz tube 65. In the quartz tube 65, a susceptor 66 is placed rotatably and hermetically. The susceptor 66 is provided with a heater 66h for heating a substrate. The temperature at a surface of a wafer 50a during deposition is monitored by an infrared thermometer 61 through a window 69 provided at a ceiling of the reaction chamber 63. The monitored temperature is a temperature which is referred to as a temperature at which growth is performed, or a deposition temperature, or a substrate temperature or the like. When it is described that an MQW structure is formed at a temperature not lower than 400° C. but not higher than 560° C. in the manufacturing method of the present invention, this temperature ranging from 400° C. to 560° C. is a temperature measured by the temperature monitor. Forced evacuation from the quartz tube 65 is performed by means of a vacuum pump.

Source gases are supplied through pipes connected to the quartz tube 65. All metal-organic source MOVPE is characterized by that all source gases are supplied in forms of metal-organic gases. Although source gases of dopants or the like are not shown in FIG. 7, dopants are also supplied in forms of metal-organic gases. The metal-organic gases are introduced in a constant temperature bath and kept at a constant temperature. Hydrogen ($H_2$) and nitrogen ($N_2$) are used as carrier gases. The metal-organic gases are carried by the carrier gases, and evacuated by the vacuum pump to be introduced into the quartz tube 65. The amount of the carrier gases is precisely controlled by mass flow controllers (MFCs). Many MFCs, electromagnetic valves, and the like are automatically controlled by a microcomputer.

A method of manufacturing the wafer 50a will be described. First, an n-type InP buffer layer 2 is epitaxially grown to a thickness of 10 nm on an S-doped n-type InP substrate 1. Tetraethylsilane (TeESi) is used as an n-type dopant. At this time, trimethylindium (TMIn) and tertiarybutylphosphine (TBP) are used as source gases. The InP buffer layer 2 may be grown by using phosphine ($PH_3$) as an inorganic source. Even if the InP buffer layer 2 is grown at a growth temperature of about 600° C. or lower, the crystallinity of the underlying InP substrate is not degraded by the heating at about 600° C. However, when forming an InP window layer, since the MQW structure including GaAsSb is disposed under the InP window layer, the substrate temperature needs to be precisely maintained within a range of, for example, not lower than 400° C. but not higher than 560° C. The reason is as follows. If the wafer is heated to about 600° C., the GaAsSb is damaged by the heat, and its crystallinity is significantly degraded. In addition, if the InP window layer is formed at a temperature lower than 400° C., the source gas decomposition efficiency is significantly reduced, and thereby the impurity concentration in the InP layer is increased. Therefore, a high-quality InP window layer cannot be obtained. Next, an n-type doped InGaAs layer is grown to a thickness of 0.15 µm (150 nm) on the InP buffer layer 2. In FIG. 1, this InGaAs layer is also included in the buffer layer 2.

Next, a type II MQW absorption layer 3 having InGaAs/GaAsSb as a pair of quantum wells is formed. As described above, in the quantum well structure, the GaAsSb preferably has a thickness $x_1$ not smaller than 3 nm but smaller than 10 nm, and the InGaAs 3b preferably has a thickness smaller than $x_1 \pm 1.0$ nm. In FIG. 1, 250 pairs of quantum wells are deposited to form the MQW absorption layer 3. For deposition of the GaAsSb, triethylgallium (TEGa), tertiarybutylarsine (TBAs), and trimethylantimony (TMSb) are used. For deposition of the InGaAs, TEGa, TMIn, and TBAs can be used. All the source gases are organic-metal gases, and the molecular weight of each compound is great. Therefore, the source gases are completely decomposed at a relatively low temperature not lower than 400° C. but not higher than 560° C., thereby contributing to the crystal growth. The composition change at an interface of quantum wells can be made sharp by forming the MQW absorption layer 3 by all metal-organic source MOVPE. As a result, highly accurate spectrophotometry is realized.

As a source of gallium (Ga), triethylgallium (TEGa) or trimethylgallium (TMGa) may be used. Preferably, TEGa is used because TEGa is superior to TMGa in reducing the impurity concentration in the crystal. Particularly, the concentration of carbon which is an impurity in the quantum well layer is $1\times10^{16}$ cm$^{-3}$ or more when TMGa is used, whereas, it is less than $1\times10^{16}$ cm$^{-3}$ when TEGa is used. As a source of indium (In), trimethylindium (TMIn) or triethylindium (TEIn) may be used. Preferably, TMIn is used because TMIn is superior to TEIn in controllability for in composition. As a source of arsenic (As), tertiarybutylarsine (TBAs) or trimethylarsenic (TMAs) may be used. Preferably, TBAs is used because TBAs is superior to TMAs in reducing the impurity concentration in the crystal. Particularly, the concentration of carbon which is an impurity in the quantum well layer is $1\times10^{16}$ cm$^{-3}$ or more when TMAs is used, whereas, it is less than $1\times10^{16}$ cm$^{-3}$ when TBAs is used. Thus, a semiconductor device in which an MQW structure has reduced impurity concentration and good crystallinity can be obtained. As a result, if the semiconductor device is applied to, for example, a photodetector, a photodetector having reduced dark current and high sensitivity can be obtained. Moreover, by using the photodetector, an optical sensor device, such as an imaging system, capable of taking clearer images can be realized.

Next, a description will be given of how the source gases flow during formation of the MQW structure 3 by all metal-organic source MOVPE. The source gases are carried through the pipes, introduced into the quartz tube 65, and evacuated.

Many kinds of source gases can be supplied to the quartz tube 65 by increasing the number of pipes. For example, even if dozen kinds of source gases are used, the source gases are controlled by open/close of the electromagnetic valves.

Flow of each source gas into the quartz tube 65 is turned on/off according to open/close of the electromagnetic valve, with the flow rate of the source gas being controlled by the mass flow controller (MFC) shown in FIG. 7. Then, the source gases are forcibly evacuated from the quartz tube 65 by the vacuum pump. The flow of the source gases is not interrupted but smoothly and automatically conducted. Accordingly, switching of compositions when forming the pairs of quantum wells is quickly performed.

Since the susceptor 66 rotates as shown in FIG. 7, the source gas temperature distribution does not have a directionality such that the source gas temperature is higher/lower at the source gas inlet side than at the source gas outlet side. Further, since the wafer 50a revolves on the susceptor 66, the flow of the source gas near the surface of the wafer 50a is in a turbulence state. Therefore, even the source gas near the surface of the wafer 50a, excluding the source gas contacting the wafer 50a, has a great velocity component in the direction of gas flow from the gas inlet side toward the gas outlet side. Accordingly, the heat, which flows from the susceptor 66 through the wafer 50a to the source gas, is mostly exhausted together with the exhaust gas, constantly.

This causes a great temperature gradient or temperature gap in the vertical direction from the wafer 50a through its surface to the source gas space.

Further, in the embodiment of the present invention, the substrate temperature is set in a low temperature range of not lower than 400° C. but not higher than 560° C. When all metal-organic source MOVPE using metal-organic sources such as TBAs is performed at such a low substrate surface temperature, the decomposition efficiency of the source is high. Therefore, the source gases, which flow in a region very close to the wafer 50a and contribute to the growth of the MQW structure, are limited to those efficiently decomposed into a form required for the growth.

Figure 8A:
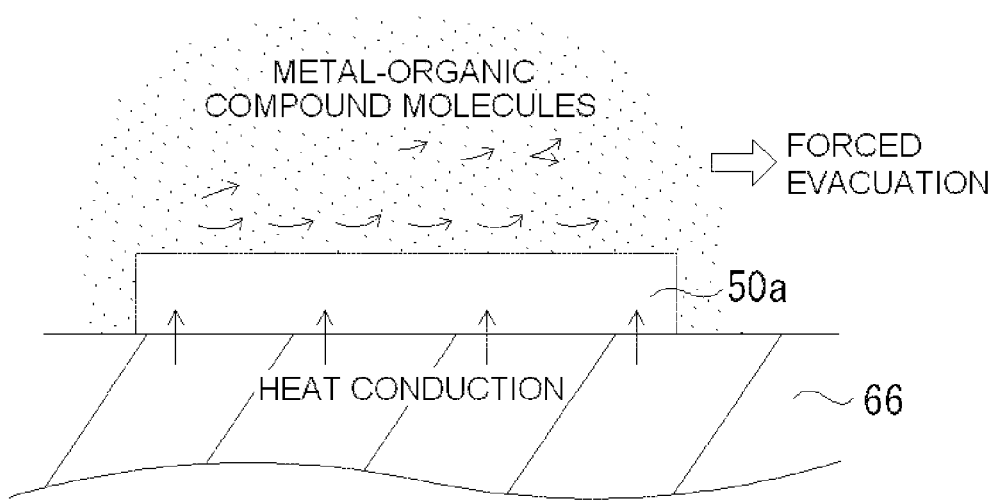
FIG. 8A is a diagram illustrating a flow of metal-organic molecules and a flow of heat.
Figure 8B:
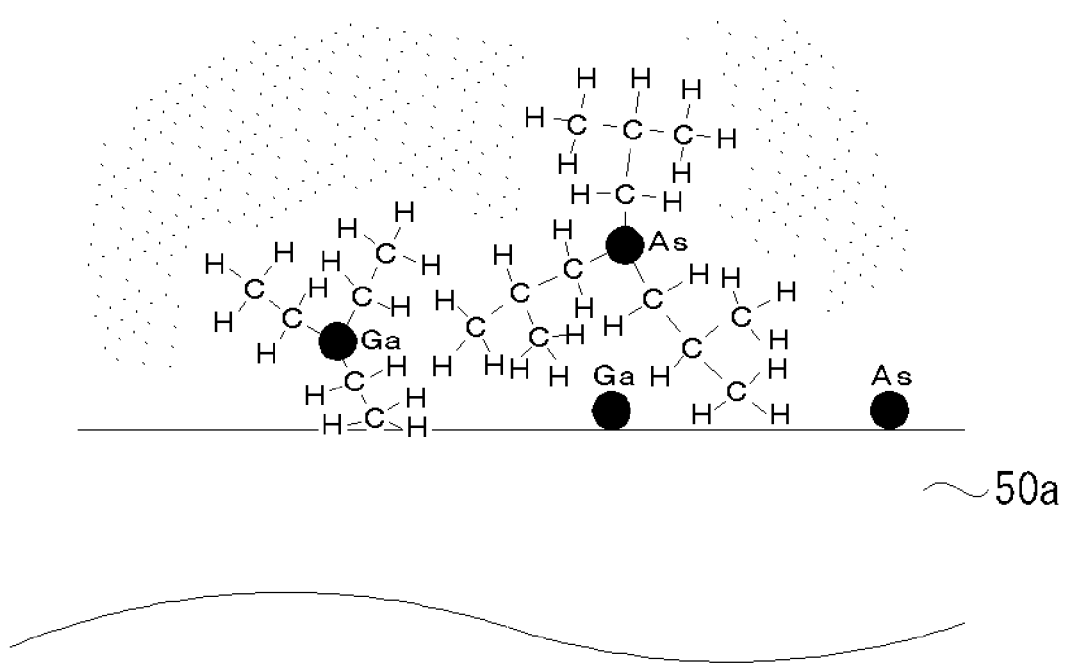
FIG. 8B is a schematic diagram illustrating metal-organic molecules at a substrate surface.

FIG. 8A is a diagram illustrating the flow of metal-organic molecules and the flow of heat, and FIG. 8B is a schematic diagram illustrating the metal-organic molecules at the substrate surface. These figures are used for explaining that setting of the surface temperature is important in order to obtain sharp composition change at heterointerfaces in the MQW structure.

Although it is assumed that the surface of the wafer 50a is at the monitored temperature, a sharp temperature drop or a great temperature gap occurs as described above in the source gas space a little above the wafer surface. Therefore, in the case of using a source gas whose decomposition temperature is T1° C., the substrate surface temperature is set at (T1+α), and the α is determined in view of variation in temperature distribution and the like. Under the situation where a sharp temperature drop or a great temperature gap occurs from the surface of the wafer 50a to the source gas space, if large-size metal-organic molecules as shown in FIG. 8B flow against the wafer surface, the compound molecules that are decomposed and contribute to crystal growth are considered to be limited to those that contact the wafer surface and those in a range equivalent to the thicknesses of a few metal-organic molecules from the wafer surface. Accordingly, as shown in FIG. 8B, it is considered that the metal-organic molecules contacting the wafer surface and the metal-organic molecules located within the region equivalent to the thicknesses of a few metal-organic molecules from the wafer surface mainly contribute to crystal growth, while the metal-organic molecules located outside the region are less likely to be decomposed and are evacuated from the quartz tube 65. When the metal-organic molecules near the surface of the wafer 50a are decomposed and contribute to crystal growth, the metal-organic molecules located outside the region enter the region as supplemental molecules.

Taking the converse point of view, by setting the wafer surface temperature at a temperature slightly higher than the decomposition temperature of the metal-organic molecules, the range of the metal-organic molecules that can participate in crystal growth can be limited to the thin source gas layer on the surface of the wafer 50a.

As understood from the above description, when the source gases suited to the chemical compositions of the above-described pair are introduced by switching the gases using the electromagnetic valves while forcibly evacuating the gases using the vacuum pump, the crystal growth is performed such that, after a crystal of the previous chemical composition was grown with slight inertia, a crystal of the chemical composition, to which the source gases have been switched, can be grown without being affected by the previous source gases. As a result, the composition change at the heterointerface can be made sharp. Such a sharp composition change means that the previous source gases do not substantially remain in the quartz tube 65, and is caused by that the source gases that flow in the region very close to the wafer 50a and contribute to the growth of the MQW structure are limited those efficiently decomposed into the form required for the growth (deposition factor 1). Specifically, as seen from FIG. 7, after one of the two layers in the quantum well is formed, the source gases for forming the other layer is introduced by opening/closing the electromagnetic valves while forcibly evacuating the gases with the vacuum pump. At this time, although some metal-organic molecules that participate in the crystal growth with slight inertia remain, the molecules of the one layer that may act as supplemental molecules are mostly evacuated and gone. As the wafer surface temperature is set closer to the decomposition temperature of the metal-organic molecules, the range of the metal-organic molecules that participate in the crystal growth (the range from the wafer surface) is reduced.

In the case of forming the MQW structure, if the MQW structure is grown at a temperature of about 600° C., phase separation occurs in the GaAsSb layers in the MQW structure, which makes it impossible to realize a clean and flat crystal growth surface of an MQW structure, and an MQW structure having excellent periodicity and crystallinity. Therefore, the growth temperature is set in the range of not lower than 400° C. but not higher than 560° C. (deposition factor 2), and all metal-organic source MOVPE is adopted as a deposition method for this growth, in which metal-organic gases having high decomposition efficiency are used as all source gases (deposition factor 3). The deposition factor 1 significantly depends on the deposition factor 3.

<Semiconductor Device Manufacturing Method>

In the semiconductor device 50 shown in FIG. 1, the InGaAs diffusive-concentration-distribution-adjusting layer 4 is located on the type II MQW absorption layer 3, and the InP window layer 5 is located on the InGaAs diffusive-concentration-distribution-adjusting layer 4. Zn as a p-type impurity is selectively diffused from the opening of the selective diffusion mask pattern 36 disposed on the surface of the InP window layer 5, thereby forming the p-type region 6. A p-n junction or p-i junction 15 is formed at an end of the p-type region 6. A reverse bias voltage is applied to the p-n junction or p-i junction 15 to form a depletion layer which traps charges caused by photoelectric conversion, and thus the brightness of a pixel is made responsive to the amount of charges. The p-type region 6 or the p-n junction (p-i junction) 15 is a main part that constitutes a pixel. The p-side electrode 11 that is in ohmic-contact with the p-type region 6 is a pixel electrode, and the amount of charges is read, pixel by pixel, between the p-side electrode 11 and the n-side electrode 12 that is set at the ground voltage. On the surface of the InP window layer that surrounds the p-type region 6, the selective diffusion mask pattern 36 is left as it is. Further, a passivation layer (not shown) composed of SiON or the like covers the selective diffusion mask pattern 36. The reason why the selective diffusion mask pattern 36 is left is as follows. After formation of the p-type region 6, if the selective diffusion mask pattern 36 is removed and the wafer is exposed to the atmosphere, a surface level is formed at the boundary between the surface of the p-type region of the window layer and the surface of a region where the mask pattern 36 is removed from, which causes an increase in dark current.

It is a point that, after formation of the MQW structure, growth is continued in the same deposition chamber or quartz tube 65 by all metal-organic source MOVPE until formation of the InP window layer 5 is completed.

In other words, it is a point that no regrown interface is formed because the wafer 50a is not taken out from the deposition chamber before formation of the InP window layer 5 to form the window layer 5 by another deposition method. That is, since the InGaAs diffusive-concentration-distribution-adjusting layer 4 and the InP window layer 5 are continuously formed in the quartz tube 65, the interfaces 16 and 17 are not regrown interfaces. Therefore, the oxygen concentration and the carbon concentration are both lower than $1 \times 10^{18}$ cm$^{-3}$, and no leakage current occurs particularly at a line where the p-type region 6 and the interface 17 intersect.

In the present embodiment, the non-doped InGaAs diffusive-concentration-distribution layer 4 having a thickness of, for example, 1.0 µm is formed on the MQW absorption layer 3. After formation of the InP window layer 5, when Zn as a p-type impurity is introduced from the InP window layer 5 to reach the MQW absorption layer 3 by a selective diffusion method, if the high-concentration Zn enters the MQW structure, the crystallinity is degraded. The InGaAs diffusive-concentration-distribution layer 4 is provided for adjusting the Zn diffusion. The InGaAs diffusive-concentration-distribution-adjusting layer 4 is not necessarily provided as described above.

The p-type region 6 is formed by the above-described selective diffusion, and the p-n junction or p-i junction 15 is formed at an end of the p-type region 6. Even when the InGaAs diffusive-concentration-distribution-adjusting layer 4 is inserted, since the InGaAs has a small band gap, the electric resistance of the photodetector can be reduced even if the InGaAs is non-doped. The reduced electric resistance leads to an increase in responsivity, thereby realizing a moving picture of high image quality.

Preferably, the undoped InP window layer 5 is epitaxially grown to a thickness of 0.8 µm on the InGaAs diffusive-concentration-distribution-adjusting layer 4 by all metal-organic source MOVPE, with the wafer 50a being placed in the same quartz tube 65. As described above, trimethylindium (TMIn) and tertiarybutylphosphine (TBP) are used as source gases.

The use of these source gases allows the growth temperature of the InP window layer 5 to be not lower than 400° C. but not higher than 560° C., and more preferably, not higher than 535° C. As a result, the GaAsSb in the MQW structure located under the InP window layer 5 is not damaged by heat, and the crystallinity of the MQW structure is not degraded. When forming the InP window layer 5, since the MQW structure including GaAsSb is disposed under the InP window layer 5, the substrate temperature should be precisely maintained within a range of not lower than 400° C. but not higher than 560° C. The reason is as follows. If the wafer is heated to about 600° C., the GaAsSb is damaged by the heat, and its crystallinity is significantly degraded. If the InP window layer is formed at a temperature lower than 400° C., the source gas decomposition efficiency is significantly reduced, and thereby the impurity concentration in the InP window layer 5 is increased. Therefore, a high-quality InP window layer 5 cannot be obtained.

Conventionally, a MQW structure has to be formed by MBE. However, growth of an InP window layer by MBE requires a solid source as a source of phosphorus, which leads to a problem in terms of safety or the like. Further, there is still a room for improvement in terms of manufacturing efficiency.

Prior to the present invention, the interface between the InGaAs diffusive-concentration-distribution-adjusting layer and the InP window layer was a regrown interface once exposed to the atmosphere. The regrown interface can be identified when it satisfies at least one of the oxygen concentration of $1 \times 10^{18}$ cm$^{-3}$ or more and the carbon concentration of $1 \times 10^{18}$ cm$^{-3}$ or more, which concentrations can be confirmed by secondary ion mass spectrometry.

The regrown interface and the p-type region form an intersection line, and leakage current occurs in the intersection line. Such leakage current significantly degrades the image quality.

Further, if the InP window layer is grown by simple MOVPE, phosphine (PH$_3$) is used as a source of phosphorus, and the decomposition temperature of phosphine is high. Such high decomposition temperature induces a thermal damage of the underlying GaAsSb, and thus the crystallinity of the MQW structure is degraded.

Figure 9:
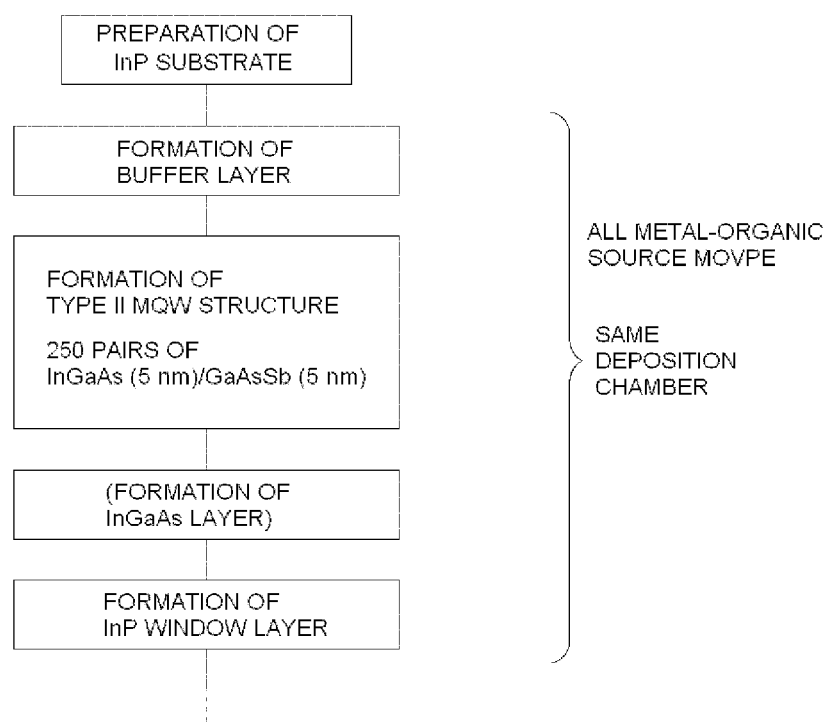
FIG. 9 is a flowchart illustrating a method of manufacturing the photodetector 50 shown in FIG. 1.

FIG. 9 is a flowchart of a method of manufacturing the photodetector 50 shown in FIG. 1. In this manufacturing method, it is important to reduce the growth temperature (deposition factor 2) by using only metal-organic gases as source gases (deposition factor 3), and to avoid formation of a recrystallization interface (deposition factor 4) by growing the layers consistently in the same deposition chamber or quartz tube 65 until formation of the InP window layer 5 is completed.

Thereby, photodetectors having less leakage current, excellent crystallinity, and sensitivity in the wavelength region from 2 μm to 5 μm can be efficiently manufactured in large numbers.

(Embodiment 2)

Figure 10:
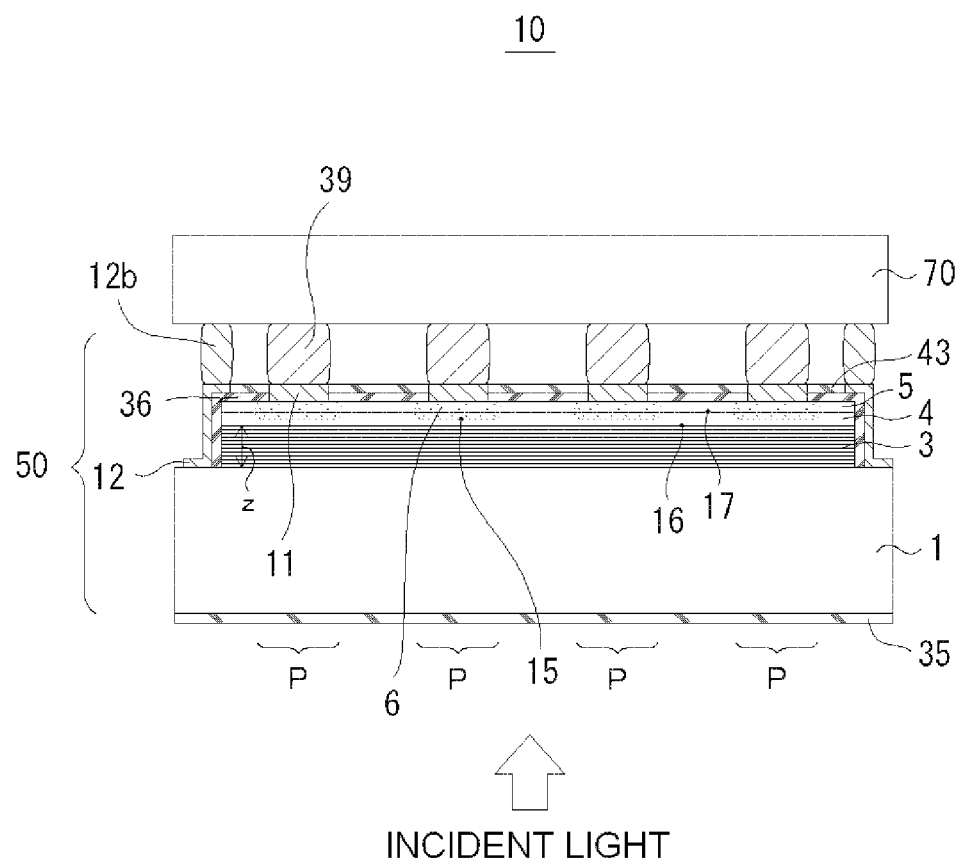
FIG. 10 is a diagram illustrating an optical sensor device including a photodetector array (semiconductor device) according to Embodiment 2 of the present invention.

FIG. 10 illustrates an optical sensor device 10 including a photodetector array (semiconductor device) 50 according to Embodiment 2 of the present invention. Optical components such as lenses are omitted. Although a passivation layer 43 composed of an SiON layer is shown in FIG. 10, the passivation layer is actually provided also in FIG. 1. The photodetector array 50 is identical to the photodetector shown in FIG. 1 in the layered structure except that a plurality of photodetectors or pixels P are arranged in the photodetector array 50. Since the photodetector array 50 is identical to the photodetector shown in FIG. 1 in the thickness z, the Sb composition y, and the like, repeated description is not necessary. Further, the photodetector array 50 is identical to the photodetector (semiconductor device) shown in FIG. 1 in that the interfaces 16 and 17 are not regrown interfaces, and the impurity concentrations of oxygen, carbon, and the like are low. The photodetector array 50 is identical to the photodetector shown in FIG. 1 in that there are no regrown interfaces.

In FIG. 10, the photodetector array 50 and a CMOS 70 constituting a readout IC are connected to each other. Readout electrodes (not shown) of the CMOS 70 and pixel electrodes (p-side electrodes) 11 of the photodetector array 50 are connected via interconnection bumps 39. A ground electrode (n-side electrode) 12 common to the pixels of the photodetector array 50, and a ground electrode (not shown) of the CMOS 70 are connected via a bump 12b. It is possible to realize an imaging device or the like by combining the CMOS 70 and the photodetector array 50, and integrating, pixel by pixel, light absorption information.

As described above, the photodetector array (semiconductor device) 50 of the present invention has sensitivity up to the long wavelength region, and reduced dark current (leakage current). Therefore, when the photodetector array 50 is applied to biological tests for animals and plants, environmental monitoring, and the like, highly precise examination can be executed.

Example

Samples of photodetectors having the configuration shown in FIG. 1 were manufactured, and the sensitivities at wavelengths of 1.3 μm, 1.55 μm, 1.65 μm, and 2.0 μm were measured. The following conditions were given as conditions for belonging to Invention Examples of the present example.

(1) Number of pairs: not smaller than 50 but not larger than 500

(2) Quantum well thicknesses $x_1$ and $x_2$: not smaller than 0.75 nm but not larger than 5 nm (3) Total thickness z of the MQW structure: not smaller than 0.5 μm but not larger than 3.5 μm (4) The ratio of the sensitivity at the wavelength of 1.3 μm to the sensitivity at the wavelength of 2.0 μm: not smaller than 0.5 but not larger than 1.6

Each of Comparative Examples lacks any one of the four conditions. The measurement result is shown in Table I.

TABLE I

| Sample | InGaAs thickness $x_1$ (nm) | GaAsSb thickness $x_2$ (nm) | Number of pairs | Total thickness z (μm) | Sensitivity at each wavelength | | | | Sensitivity ratio | Decision |
|---|---|---|---|---|---|---|---|---|---|---|
| | | | | | 1.3 μm (A/W) | 1.55 μm (A/W) | 1.65 μm (A/W) | 2.0 μm (A/W) | 1.3 μm/ 2.0 μm | |
| Comparative Example 1 | 5 | 5 | 30*⁾ | 0.3 | 0.12 | 0.18 | 0.18 | 0.06 | 2.0*⁾ | Failure |
| Invention Example 2 | 5 | 5 | 50 | 0.5 | 0.15 | 0.25 | 0.24 | 0.10 | 1.5 | Pass |
| Invention Example 3 | 5 | 5 | 200 | 2.0 | 0.36 | 0.54 | 0.53 | 0.36 | 1.0 | Pass |
| Invention Example 4 | 5 | 5 | 250 | 2.5 | 0.28 | 0.53 | 0.75 | 0.57 | 0.5 | Pass |
| Invention Example 5 | 5 | 5 | 350 | 3.5 | 0.40 | 0.48 | 0.68 | 0.80 | 0.5 | Pass |
| Comparative Example 6 | 5 | 5 | 400 | 4.0*⁾ | 0.36 | 0.44 | 0.63 | 0.91 | 0.4*) | Failure |
| Invention Example 7 | 1 | 1 | 250 | 0.5 | 0.64 | 0.57 | 0.54 | 0.32 | 2.0 | Pass |
| Invention Example 8 | 2 | 2 | 250 | 1.0 | 0.90 | 0.80 | 0.75 | 0.60 | 1.5 | Pass |
| Invention Example 9 | 4 | 4 | 250 | 2.0 | 0.60 | 0.74 | 0.70 | 0.60 | 1.0 | Pass |
| Invention Example 10 | 5 | 5 | 250 | 2.5 | 0.28 | 0.53 | 0.75 | 0.57 | 0.5 | Pass |
| Comparative Example 11 | 6*⁾ | 6*⁾ | 250 | 3.0 | 0.15 | 0.41 | 0.62 | 0.44 | 0.4*⁾ | Failure |

Note that symbol *⁾ indicates conditions outside the ranges of the conditions (1) to (4) for Invention Examples of the present example.

(F1) Influence of the Number of Pairs

In Comparative Examples as well as Invention Examples, when the quantum well thicknesses $x_1$ and $x_2$ are constant (5 nm) and the number of pairs is varied from 30 to 400, the sensitivity at the wavelength of 2.0 μm is monotonically and reliably increased from 0.06 to 0.91. On the other hand, the sensitivity at the wavelength of 1.3 μm is increased until the number of pairs reaches about 200 (until the total thickness z of the MQW structure reaches about 2.0 μm). However, when the number of pairs exceeds about 200, the increase in the sensitivity tends to be saturated. Increasing the number of pairs with the quantum well thicknesses being constant means increasing the total thickness z of the MQW structure. The sensitivity at the wavelength of 2.0 μm appears to be increased with increase in the number of pairs, regardless of increase in the total thickness z of the MQW structure.

(F2) Influence of the Quantum Well Thicknesses $x_1$ and $x_2$

When the quantum well thicknesses $x_1$ and $x_2$ are increased from 1 nm to 6 nm (the total thickness z of the MQW structure is also increased) with the number of pairs being fixed to 250, the sensitivity at the wavelength of 2.0 μm is low when the thicknesses $x_1$ and $x_2$ are 1 nm, but hovers between about 0.5 A/W and 0.6 A/W and does not show clear tendency when the thicknesses $x_1$ and $x_2$ are 2 nm or more. On the other hand, the sensitivity at the wavelength of 1.3 μm is 0.64 A/W for the thicknesses $x_1$ and $x_2$ being 1 nm, 0.90 A/W for 2 nm or more, 0.60 A/W for 4 nm, 0.28 A/W for 5 nm, and 0.15 A/W for 6 nm. Thus, the sensitivity has a great peak when the thicknesses $x_1$ and $x_2$ are 1 nm to 4 nm. The sensitivity at the wavelength of 1.3 μm is greatly influenced by the quantum well thicknesses $x_1$ and $x_2$, and the optimum thicknesses are within the range from 1 nm to 4 nm. When the thicknesses $x_1$ and $x_2$ exceed this range, the sensitivity is sharply degraded.

(F3) Influence of the Total Thickness z of the MQW Structure

Since the factors of the quantum well thicknesses $x_1$ and $x_2$ and the number of pairs have mutual influences with the total thickness z, it is difficult to isolate the influence of the total thickness z. It is clear that, when the total thickness z is increased, the sensitivity at the wavelength of 2 μm is certainly increased while the sensitivity at the wavelength of 1.3 μm is not increased very much, and therefore, the ratio between these sensitivities tends to deviate from the range not smaller than 0.5. Therefore, it is difficult to achieve flatness of the sensitivity from the short wavelength of about 1.3 μm to the long wavelength of about 2.5 μm in the near-infrared absorption region.

Comparative Examples which lack at least one of the conditions (1) to (3) of the present invention do not satisfy the condition (4). Particularly, in Comparative Example 11 (which lacks the condition (2)) in which the thicknesses of the respective layers in the MQW structure are excessive, and in Comparative Example 6 (which lacks the condition (3)) in which the total MQW thickness is excessive, the sensitivity at the wavelength of 1.3 μm on the short wavelength side is considerably lower than the sensitivity at the wavelength of 2.0 μm on the long wavelength side. Further, in Comparative Example 1 (which lacks the condition (1)) in which the number of pairs is excessively small, the sensitivity at the wavelength of 2.0 μm is very low. These results coincide with the above description.

Embodiments of the present invention have been described above. However, the embodiments of the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

Industrial Applicability

According to the photodetector of the present invention, it is possible to achieve flatness of sensitivity, which causes no problem in practical use, over the near-infrared absorption region from the short wavelength of about 1 μm to the long wavelength of about 3.0 μm. In particular, by performing MQW growth by all metal-organic source MOVPE, epitaxial layers including an InP window layer can be grown with high efficiency, and moreover, the flatness of sensitivity can be further improved.

DESCRIPTION OF THE REFERENCE CHARACTERS

1 InP substrate
2 buffer layer (InP and/or InGaAs)
3 type II MQW absorption layer
4 InGaAs layer (diffusive-concentration-distribution-adjusting layer)
5 InP window layer
6 p-type region
10 optical sensor device (detection device)
11 p-side electrode (pixel electrode)
12 ground electrode (n-side electrode)
12b bump
15 p-n junction
16 interface between MQW and InGaAs layer
17 interface between InGaAs layer and InP window layer
35 AR (Anti-Reflection) layer
36 selective diffusion mask pattern
39 interconnection bump
43 passivation layer (SiON layer)
50 photodetector (photodetector array)
50a wafer (interim product)
60 deposition apparatus for all metal-organic source MOVPE
61 infrared thermometer
63 reaction chamber
65 quartz tube
69 window of reaction chamber
66 susceptor
66h heater
70 CMOS
P pixel
$x_1$ thickness of GaAsSb
$x_2$ thickness of InGaAs
z total MQW thickness

The invention claimed is

1. A photodetector which includes, on an InP substrate, an absorption layer of a type II multiple quantum well (MQW) structure comprising a repeated structure of $In_xGa_{1-x}As$ ($0.38 \leq x \leq 0.68$) and $GaAs_{1-y}Sb_y$ ($0.36 \leq y \leq 0.62$), and has sensitivity in a near-infrared region including wavelengths of 1.3 μm and 2.0 μm, wherein a ratio of the sensitivity at the wavelength of 1.3 μm to the sensitivity at the wavelength of 2.0 μm is not smaller than 0.5 but not larger than 1.6, wherein InP-based epitaxial layers including the MQW structure are located on the InP substrate, an InP window layer is provided at a front surface of the InP-based epitaxial layers, and an oxygen concentration and a carbon concentration are both lower than $1 \times 10^{18}$ cm$^{-3}$ at interfaces formed between a bottom surface and the front surface of the InP-based epitaxial layers.

2. The photodetector according to claim 1, having a structure in which incident light enters the photodetector from the substrate side.

3. The photodetector according to claim 1, wherein a total thickness of the MQW structure is not smaller than 0.5 μm but not larger than 3.5 μm.

4. The photodetector according to claim 1, wherein a thickness of the first compound semiconductor and a thickness of the second compound semiconductor are both not smaller than 0.75 nm but not larger than 5 nm.

5. A method of manufacturing a photodetector which includes, on an InP substrate, an absorption layer of a type II multiple quantum well (MQW) structure comprising a repeated structure of $In_xGa_{1-x}As$ ($0.38 \leq x \leq 0.68$) and $GaAs_{1-y}Sb_y$ ($0.36 \leq y \leq 0.62$), and has sensitivity in a near-infrared region including wavelengths of 1.3 μm and 2.0 μm, wherein the ratio of the sensitivity at the wavelength of 1.3 μm to the sensitivity at the wavelength of 2.0 μm is not smaller than 0.5 but not larger than 1.6, wherein InP-based epitaxial layers including the MQW structure are located on the InP substrate, an InP window layer is provided at a front surface of the InP-based epitaxial layers, and the InP-based epitaxial layers including the MQW structure and the InP window layer are grown on the InP substrate in the same growth chamber consistently by metal-organic vapor phase epitaxy using only metal-organic sources.

6. The method of manufacturing a photodetector according to claim 5, wherein the photodetector has a structure in which incident light enters the photodetector from the substrate side.

7. The method of manufacturing a photodetector according to claim 5, wherein a total thickness of the MQW structure is not smaller than 0.5 μm but not larger than 3.5 μm.

8. The method of manufacturing a photodetector according to claim 5, wherein a thickness of the first compound semiconductor and a thickness of the second compound semiconductor are both not smaller than 0.75 nm but not larger than 5 nm.

9. The method of manufacturing a photodetector according to claim 5, wherein in a formation process of the MQW structure, the MQW structure is formed at a temperature not lower than 400° C. but not higher than 560° C.

10. The method of manufacturing a photodetector according to claim 5, wherein an oxygen concentration and carbon concentration are both lower than $1 \times 10^{18}$ cm$^{-3}$ at interfaces formed between the bottom surface and the front surface of the InP-based epitaxial layers.

* * * * *